United States Patent
Suyama

(10) Patent No.: US 7,492,300 B2
(45) Date of Patent: Feb. 17, 2009

(54) ANALOG-DIGITAL CONVERSION APPARATUS AND DIGITAL-ANALOG CONVERSION APPARATUS

(75) Inventor: Shohei Suyama, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/908,800

(22) PCT Filed: Jun. 6, 2005

(86) PCT No.: PCT/JP2005/010372

§ 371 (c)(1),
(2), (4) Date: Sep. 17, 2007

(87) PCT Pub. No.: WO2006/131962

PCT Pub. Date: Dec. 14, 2006

(65) Prior Publication Data

US 2008/0143563 A1   Jun. 19, 2008

(51) Int. Cl.
*H03M 1/12* (2006.01)
(52) U.S. Cl. .................. 341/155; 341/120; 341/144
(58) Field of Classification Search ............. 341/120, 341/144, 155
See application file for complete search history.

(56) References Cited

U.S. PATENT DOCUMENTS

| 5,959,563 | A  | * | 9/1999  | Ring ............................ 341/155 |
| 6,593,871 | B1 | * | 7/2003  | Miethig et al. ............... 341/157 |
| 2006/0279441 | A1 | * | 12/2006 | Straussnig et al. .......... 341/118 |

FOREIGN PATENT DOCUMENTS

| JP | 62 202690   | 9/1987 |
| JP | 4 150354    | 5/1992 |
| JP | 10 13715    | 1/1998 |
| JP | 11 122112   | 4/1999 |
| JP | 2002 101080 | 4/2002 |
| JP | 2004 173081 | 6/2004 |

* cited by examiner

*Primary Examiner*—Khai M Nguyen
(74) *Attorney, Agent, or Firm*—Oblon, Spivak, McClelland, Maier & Neustadt, P.C.

(57) ABSTRACT

An analog-digital conversion apparatus has a jitter detecting circuit for detecting the amount of jitter included in a sampling clock generated, and a jitter applying circuit for providing an analog signal to be subjected to the analog-digital conversion with a delay based on the amount of jitter detected to prevent phase shift of the sampling due to jitter of the sampling clock in the analog-digital converter.

10 Claims, 10 Drawing Sheets

ANALOG-DIGITAL CONVERSION APPARATUS AND DIGITAL-ANALOG CONVERSION APPARATUS

This application is a 371 of PCT/JP2005/010372 filed on Jun. 6, 2005.

TECHNICAL FIELD

The present invention relates to an analog-digital conversion apparatus and a digital-analog conversion apparatus capable of reducing deterioration in conversion accuracy.

BACKGROUND ART

It is known in an analog-digital conversion apparatus that jitter included in an input sampling clock will vary the sampling phase of the signal to be converted and deteriorate conversion accuracy. To suppress the deterioration in conversion accuracy due to jitter, a method is generally employed which uses an oscillator with low jitter to generate the sampling clock. In addition, Patent Document 1, for example, proposes a method of correcting the deterioration due to jitter after converting a signal to be converted to a digital signal.

On the other hand, the same deterioration in conversion accuracy due to jitter occurs in a digital-analog conversion apparatus as well. With this apparatus, the period over which the analog value is maintained at a fixed value is identical to the period of the sampling clock. Thus, the period over which the analog value is maintained at a fixed value fluctuates owing to jitter, and spurious frequency components are superimposed, thereby deteriorating the conversion accuracy. In this case also, to reduce the deterioration in conversion accuracy, a method is generally employed which uses an oscillator with low jitter to generate the sampling clock.

Patent Document 1: Japanese patent laid-open No. 4-150354/1992.

Although the conventional analog-digital conversion apparatus and digital-analog conversion apparatus employ the foregoing methods to reduce the deterioration in conversion accuracy, they have a problem of increasing cost because of the high accuracy required when using the oscillator with low jitter. In addition, the method described in Patent Document 1 has a problem of requiring a configuration for carrying out complicated digital processing to correct the deterioration in conversion accuracy.

The present invention is implemented to solve the foregoing problems. Therefore it is an object of the present invention to provide an analog-digital conversion apparatus and a digital-analog conversion apparatus capable of preventing the deterioration in the conversion accuracy even if the sampling clock includes jitter.

DISCLOSURE OF THE INVENTION

An analog-digital conversion apparatus in accordance with the present invention includes: an analog-digital converter for carrying out analog-digital conversion of an analog signal; an oscillator for generating a sampling clock used for sampling the analog signal by the analog-digital converter; a jitter detecting circuit for detecting the amount of jitter included in the sampling clock generated; and a jitter applying circuit for providing the analog signal to be subjected to the analog-digital conversion with a delay based on the amount of jitter detected to prevent phase shift of the sampling due to jitter of the sampling clock in the analog-digital converter.

In this way, it offers an advantage of being able to compensate for the distortion due to the jitter in the sampling by shifting the phase of the analog signal to be subjected to the analog-digital conversion before the conversion in accordance with the amount of jitter of the sampling clock. As a result, it can obtain substantially the same sampled values as in the ideal conditions in which the jitter of the sampling clock is not present, thereby offering an advantage of being able to implement highly accurate analog-digital conversion.

BEST MODE FOR CARRYING OUT THE INVENTION

The best mode for carrying out the invention will now be described with reference to the accompanying drawings to explain the present invention in more detail.

EMBODIMENT 1

Figure 1:
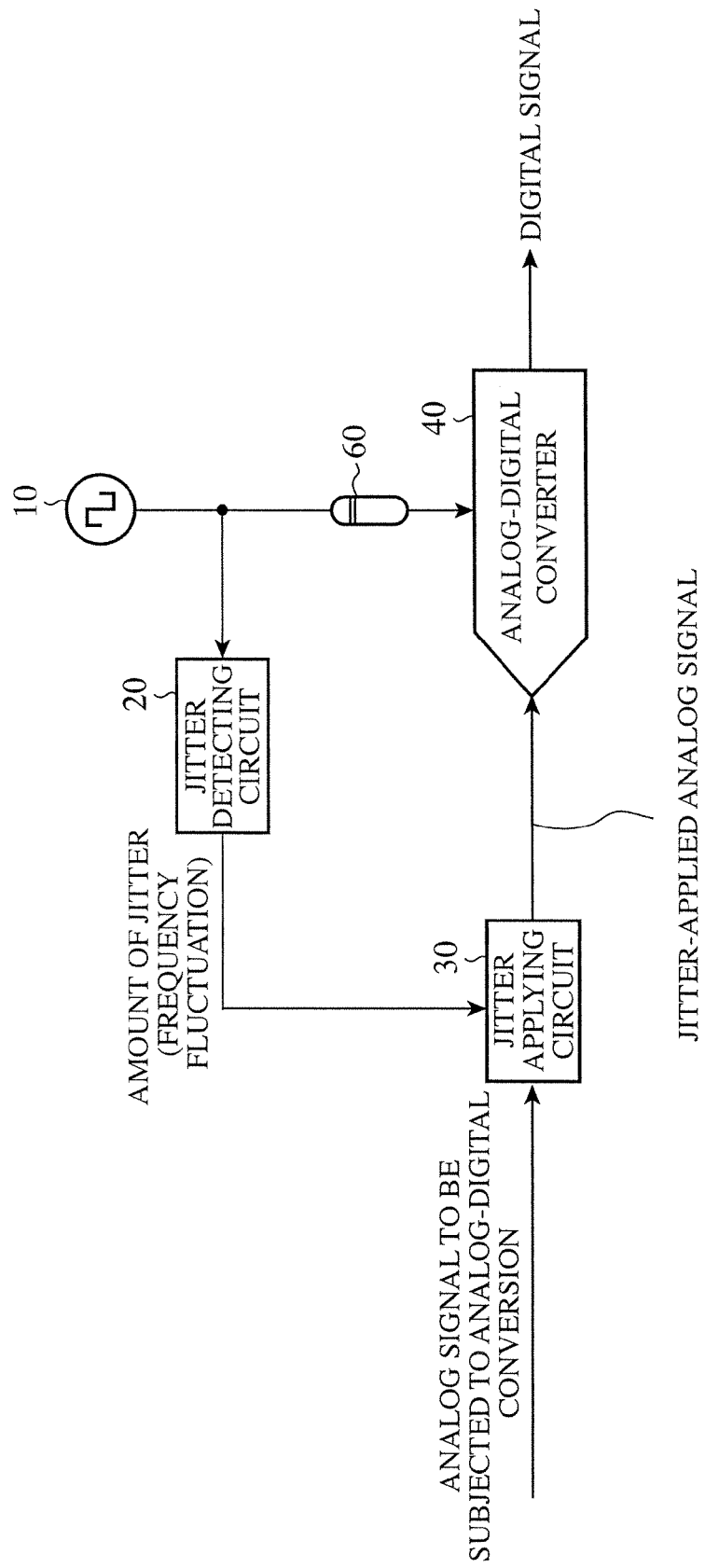
FIG. 1 is a block diagram showing a configuration of an analog-digital conversion apparatus of an embodiment 1 in accordance with the present invention.

FIG. 1 is a block diagram showing a configuration of the analog-digital conversion apparatus of an embodiment 1 in accordance with the present invention.

In FIG. 1, an oscillator 10, which is an oscillator for generating a sampling clock, has a possibility that the sampling clock includes a jitter component. The output sampling clock is supplied to a jitter detecting circuit 20 and an analog-digital converter 40. The jitter detecting circuit 20 detects the amount of jitter included in the sampling clock generated by the oscillator 10, and supplies it to a jitter applying circuit 30. The jitter applying circuit 30 carries out phase shift processing by providing a delay based on the amount of jitter detected by the jitter detecting circuit 20 to the analog signal to be subjected to the analog-digital conversion by the analog-digital converter 40. The analog-digital converter 40 converts the analog signal to be subjected to the analog-digital conversion, which passes through the phase shift processing based on the delay, to a digital signal. A delay element 60 provides the sampling clock input to the analog-digital converter 40 with a delay equal to the processing time of the jitter detecting circuit 20 and jitter applying circuit 30.

Figure 2:
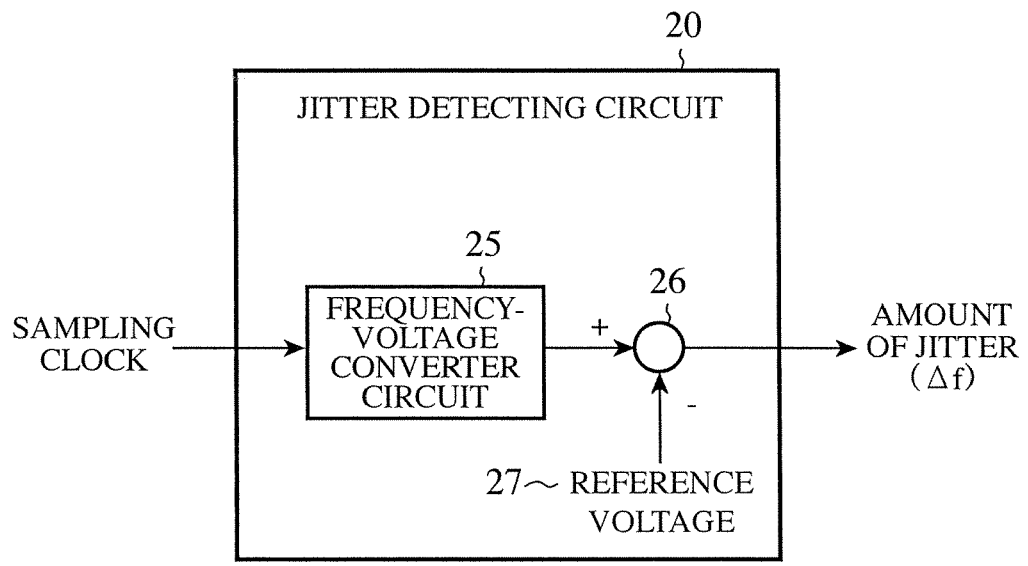
FIG. 2 is a block diagram showing a configuration of a jitter detecting circuit of the embodiment 1 in accordance with the present invention.
Figure 3:
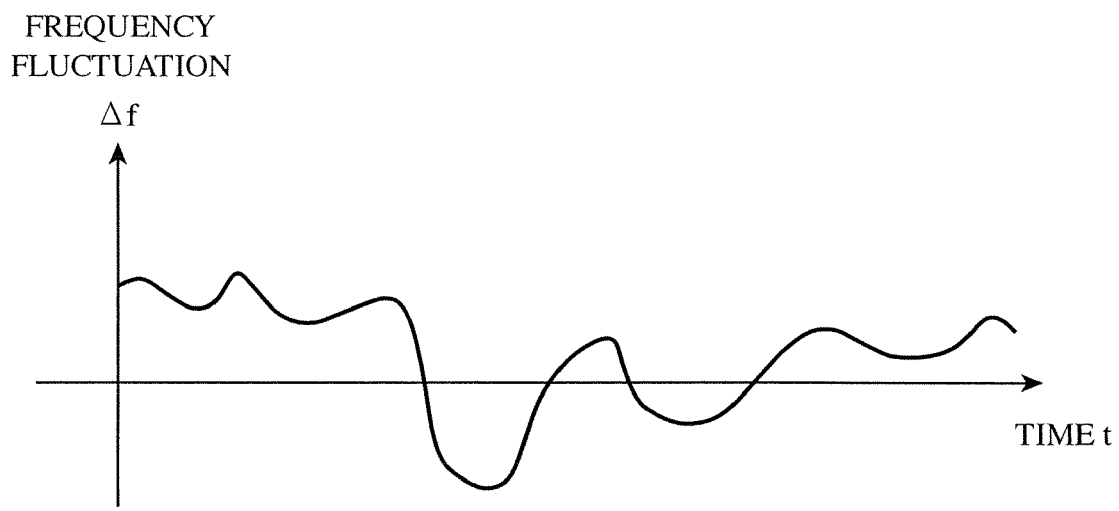
FIG. 3 is a time chart illustrating an output example of the jitter detecting circuit of the embodiment 1 in accordance with the present invention.

The jitter detecting circuit 20 has a configuration as shown in FIG. 2, for example. A frequency-voltage converter circuit 25 converts, when supplied with the sampling clock generated by the oscillator 10, the frequency of the sampling clock to a voltage signal. The voltage signal converted undergoes subtraction processing by a subtracter 26 that subtracts a reference voltage 27 from the voltage signal, and becomes a voltage signal representing only frequency fluctuation. Here, consider the case where it is assumed that the frequency of the sampling clock of the oscillator 10 is 30.72 MHz, and the frequency fluctuates about that frequency (30.72 MHz) because of jitter. When the reference voltage 27 is the voltage corresponding to 30.72 MHz passing through the frequency-voltage conversion, the detection voltage (the amount of jitter) output from the jitter detecting circuit 20 becomes a voltage fluctuating about zero volt in response to fluctuations in the frequency due to the jitter. FIG. 3 illustrates an example of the amount of jitter detected by the jitter detecting circuit 20. The horizontal axis is a time axis, and the vertical axis represents the amount of jitter in terms of frequency fluctuation $\Delta f$.

Figure 4:
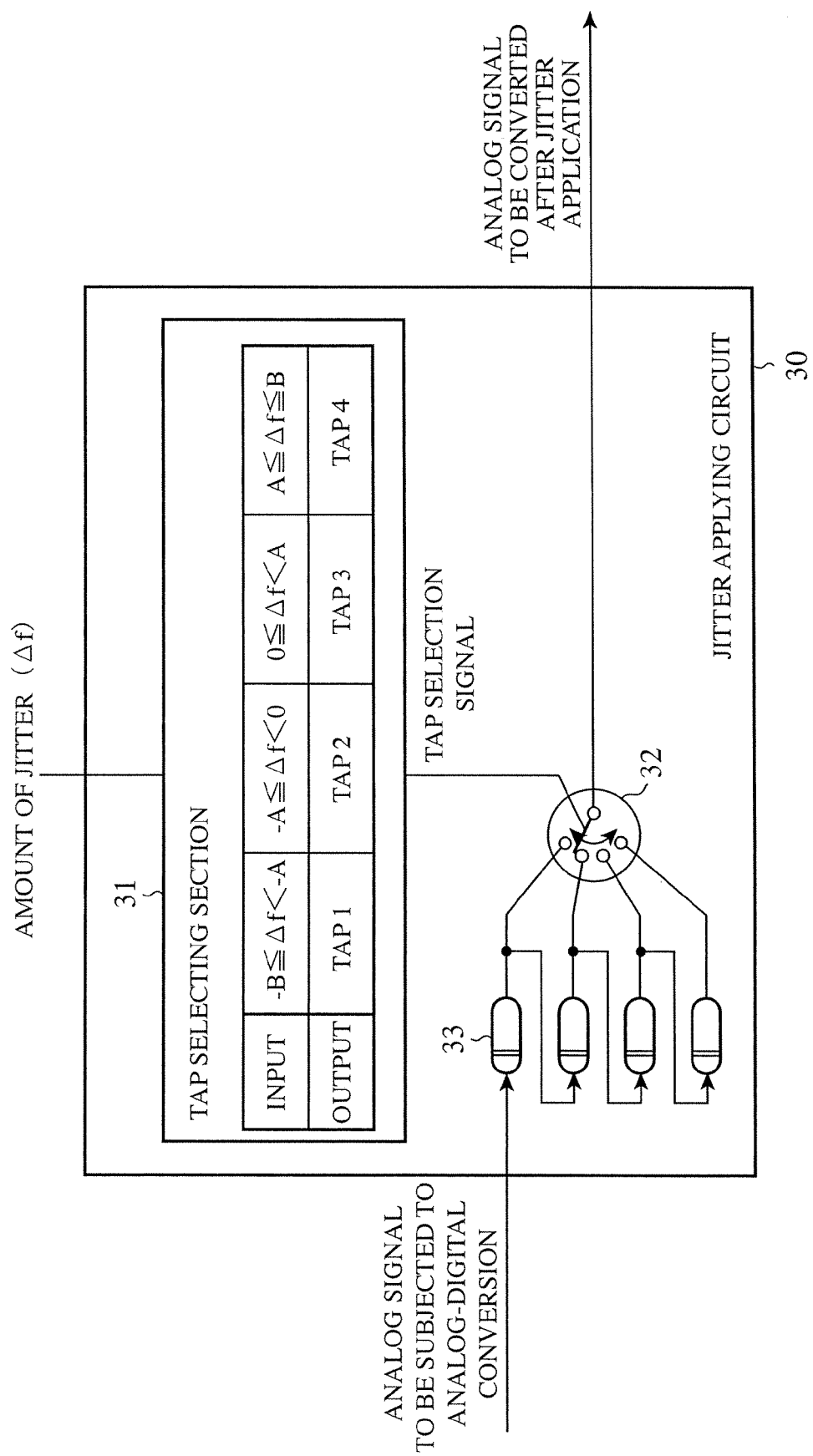
FIG. 4 is a block diagram showing a configuration of a jitter applying circuit of the embodiment 1 in accordance with the present invention.

The jitter applying circuit 30 has a configuration as shown in FIG. 4. A tap selecting section 31, receiving the frequency fluctuation $\Delta f$ which is detected by the jitter detecting circuit 20 and represents the amount of jitter, compares them with a predetermined reference voltage (such as −B, −A, 0, A, B). The frequency fluctuation $\Delta f$ is replaced by a tap selection signal according to the large and small relationships with the reference voltage, and the tap selection signal is supplied to a tap switching section 32. On the other hand, the analog signal to be subjected to the analog-digital conversion is supplied to a first end of the series connection of a plurality of delay elements 33, and is provided with the delay as follows. When the number of the delay elements 33 connected in series is assumed to be four as shown in FIG. 4 (actually the number is great), the delay output can be pulled out of each of the four output terminals of the delay elements. Each output terminal of the delay elements 33 is connected to a corresponding tap of the tap switching section 32. Each tap is selected in response to the tap selection signal, and the signal obtained from the tap selected becomes the analog signal to be subjected to the analog-digital conversion, to which the delay corresponding to the frequency fluctuation $\Delta f$ is provided. Thus, the analog signal to be subjected to the analog-digital conversion passes through the phase shift processing according to the amount of jitter detected.

Next, the details of the sampling operation when employing the analog-digital conversion apparatus of FIG. 1 will be described.

Figure 5:
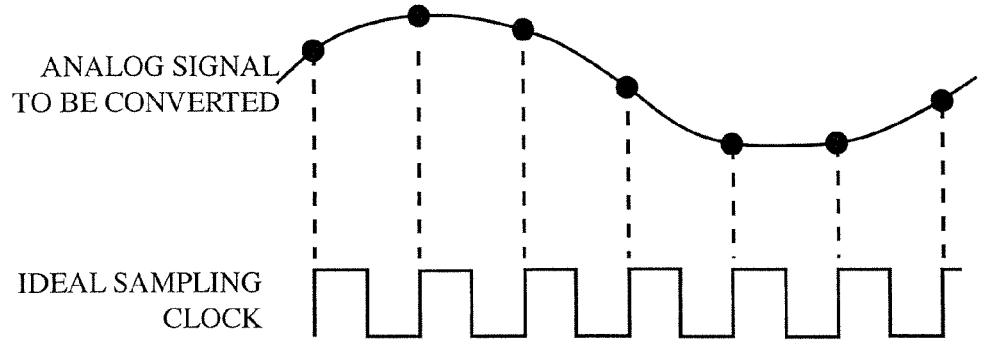
FIG. 5 is a diagram illustrating sampling operation of an ideal sampling clock.
Figure 6:
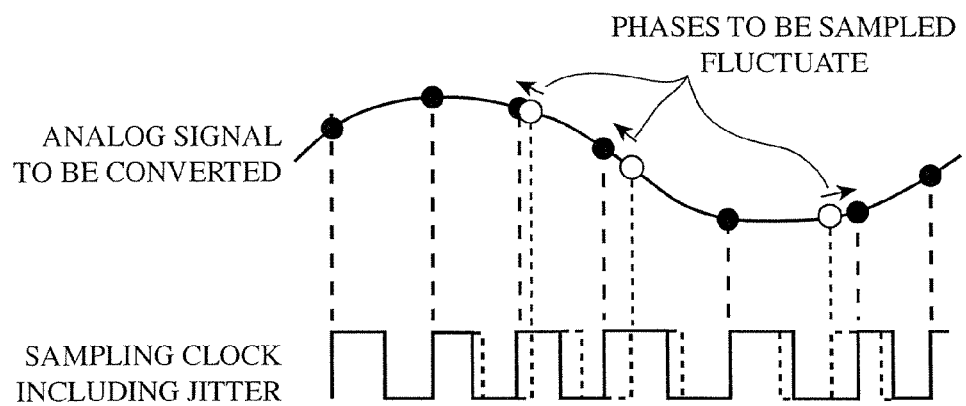
FIG. 6 is a diagram illustrating conventional sampling operation based on a sampling clock including jitter.
Figure 7:
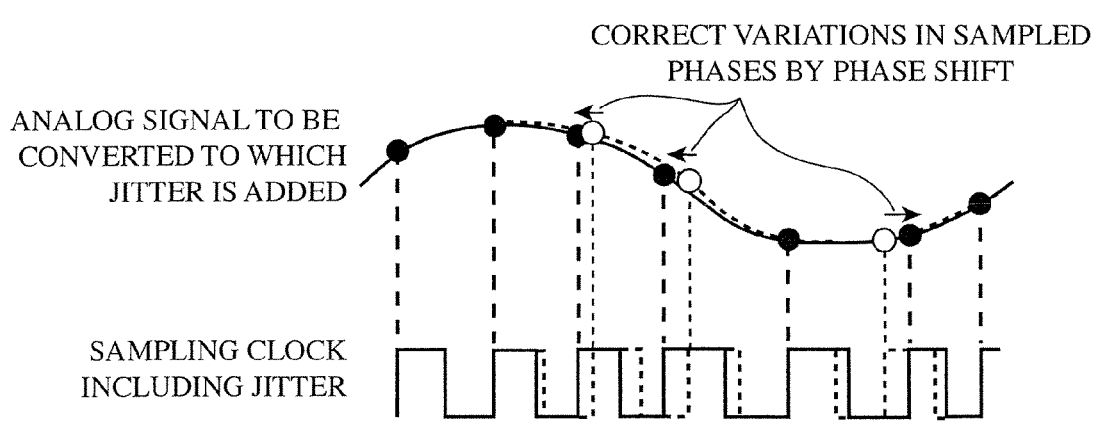
FIG. 7 is a diagram illustrating sampling operation based on a sampling clock including jitter of the embodiment 1 in accordance with the present invention.

If an ideal sampling clock without any jitter component is used, the analog signal to be subjected to the analog-digital conversion is free from phase fluctuations as illustrated in FIG. 5. Thus, it is sampled at regular intervals. In practice, however, the sampling clock delivered from the oscillator 10 is apt to include the jitter component. Accordingly, when only the analog-digital converter 40 is used, the analog signal to be subjected to the analog-digital conversion is sampled by the sampling clock including the jitter component, and becomes as illustrated in FIG. 6. More specifically, since the sampling clock varies its sampling phases from its original value due to the jitter, the sampling values differ from those of FIG. 5, thereby deteriorating the conversion accuracy by these amounts. In contrast with this, when the analog-digital conversion apparatus in accordance with the present invention is applied, the analog-digital conversion is carried out after the analog signal to be subjected to the analog-digital conversion is provided with the delay corresponding to the amount of jitter detected as illustrated in FIG. 7. Thus, the deterioration in conversion accuracy due to jitter can be compensated. The compensation is carried out by the jitter applying circuit 30 by adding the delay corresponding to the amount of jitter detected to the analog signal to be subjected to the analog-digital conversion. As a result, the sampled values obtained by the analog-digital conversion become substantially equal to the values in the ideal state without jitter.

As described above, the present embodiment 1 is configured in such a manner that the jitter detecting circuit detects the amount of jitter included in the sampling clock, and the jitter applying circuit provides the delay based on the amount of jitter detected to the analog signal to be subjected to the analog-digital conversion, thereby preventing the phase shift of the sampling in the analog-digital converter due to the jitter of the sampling clock. Thus, the present embodiment 1 can obtain substantially the same sampled values as in the ideal condition without jitter, thereby being able to implement the highly accurate analog-digital conversion.

EMBODIMENT 2

The foregoing embodiment 1 is described by way of example of oversampling in which the frequency band of the analog signal to be subjected to the analog-digital conversion is equal to or less than half the frequency of the sampling clock. The present embodiment 2 will be described by way of example of the analog-digital conversion apparatus that carries out undersampling.

Figure 8:
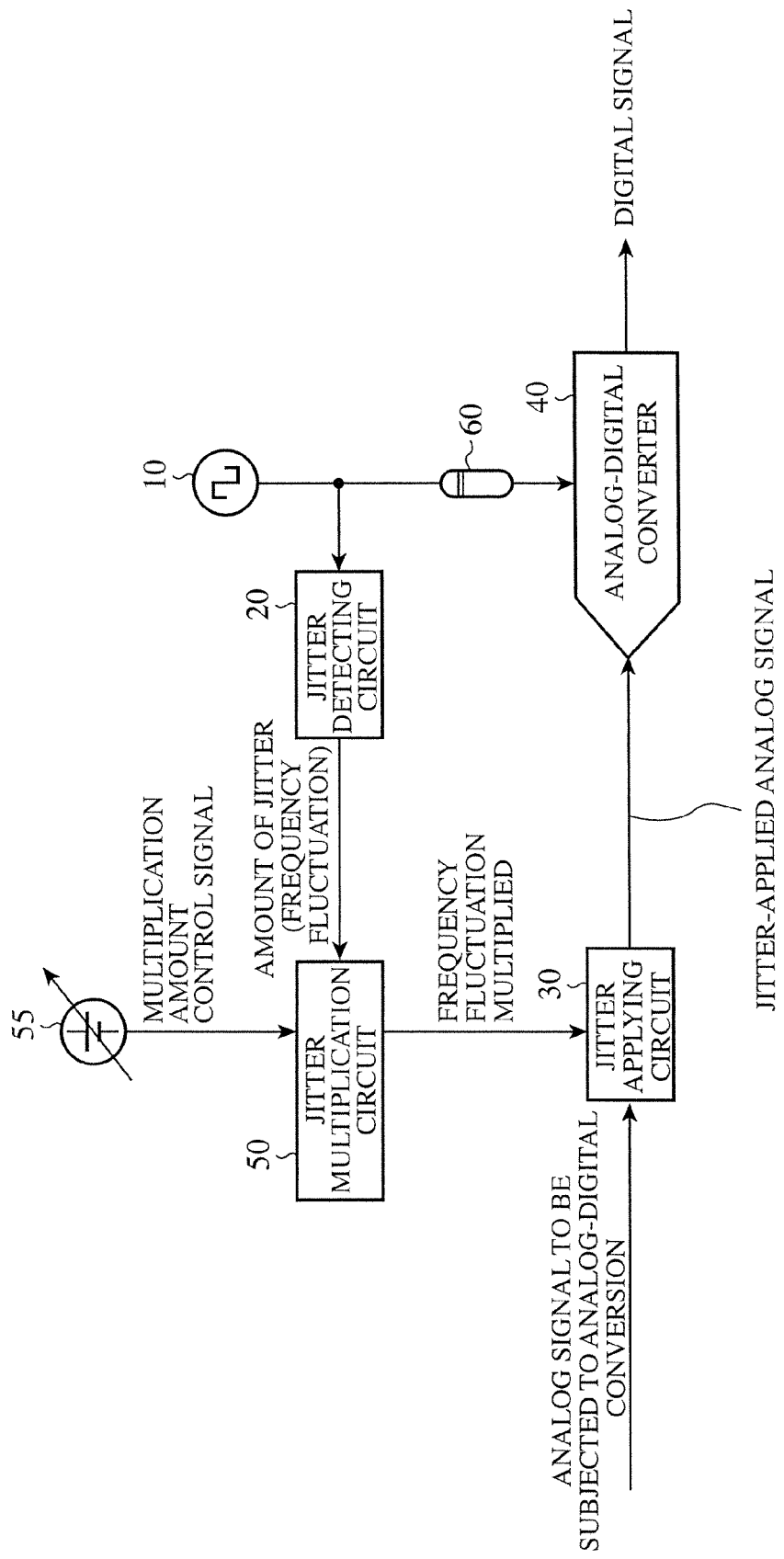
FIG. 8 is a block diagram showing a configuration of the analog-digital conversion apparatus of an embodiment 2 in accordance with the present invention.

Assume here that the frequency of the sampling clock is fs, the minimum frequency in the frequency band of the analog signal to be subjected to the analog-digital conversion is fmin, and the maximum frequency is fmax. When sampling the signal in the conditions of $$N \times fs \leq fmin \text{ and } fmax \leq (N+1) \times fs \tag{1}$$

by the sampling clock frequency fs, the fluctuations in the sampled phases involved in the jitter of the sampling clock as shown in FIG. 6 increase by a factor of N. FIG. 8 is a block diagram showing a configuration of the analog-digital conversion apparatus of the embodiment 2 in accordance with the present invention, which considers the case of undersampling.

In FIG. 8, the same components as those of FIG. 1 are designated by the same reference numerals and their description will be omitted in principle. The configuration includes in addition to that of FIG. 1 a jitter multiplication circuit 50 and a variable DC voltage source 55.

The jitter multiplication circuit 50 is a circuit for multiplying the amount of jitter, the output of the jitter detecting circuit 20, by N. The value N is made variable by a control signal output from the variable DC voltage source 55. The amount of jitter multiplied by the jitter multiplication circuit 50 is supplied to the jitter applying circuit 30. The jitter applying circuit 30 adds to the analog signal to be subjected to the analog-digital conversion a delay that will provide the phase shift of N times, and outputs.

As described above, the embodiment 2 is configured in such a manner that the jitter amount multiplication circuit multiplies the amount of jitter detected by the jitter detecting circuit, and the jitter applying circuit provides the analog signal to be subjected to the analog-digital conversion with the delay based on the amount of jitter multiplied. Thus, the analog-digital converter can obtain substantially the same sampled values as those in the ideal condition without jitter, thereby being able to implement the highly accurate analog-digital conversion for the undersampling.

EMBODIMENT 3

Figure 9:
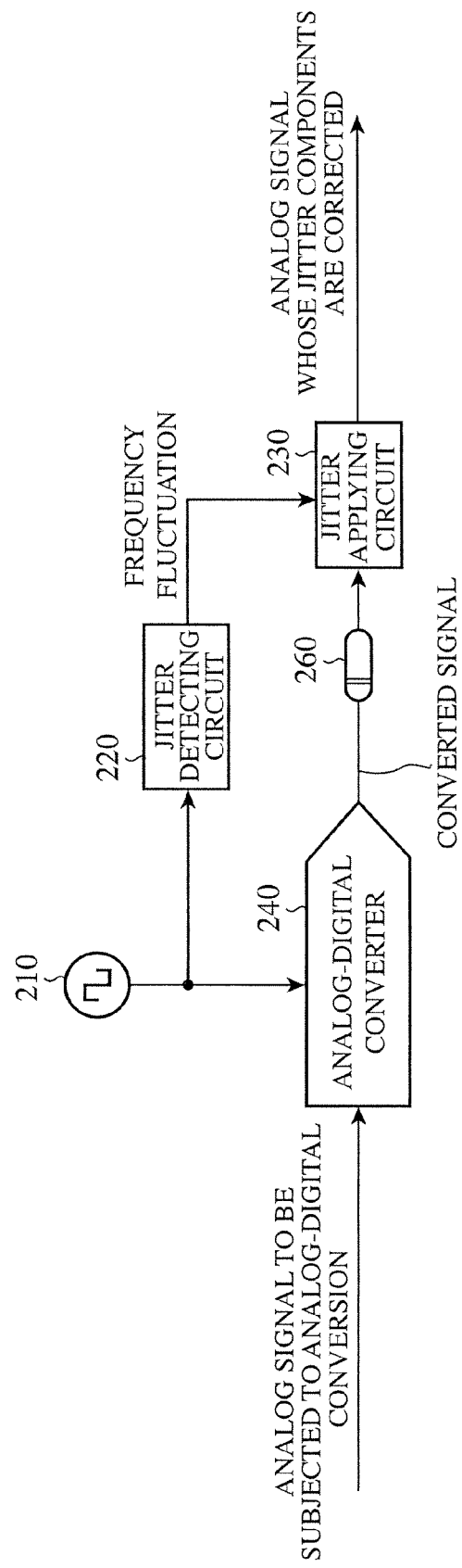
FIG. 9 is a block diagram showing a configuration of a digital-analog conversion apparatus of an embodiment 3 in accordance with the present invention.

FIG. 9 is a block diagram showing a configuration of the digital-analog conversion apparatus of an embodiment 3 in accordance with the present invention.

In FIG. 9, an oscillator 210, which is an oscillator for generating a sampling clock, has a possibility that the sampling clock includes a jitter component. The sampling clock generated is supplied to a jitter detecting circuit 220 and a digital-analog converter 240. The jitter detecting circuit 220 detects the amount of jitter included in the sampling clock generated by the oscillator 210, and supplies it to a jitter applying circuit 230. The jitter applying circuit 230 carries out phase shift processing for the signal converted by the digital-analog converter 240 according to the delay based on the amount of jitter detected by the jitter detecting circuit 220. The digital-analog converter 240 carries out digital-analog conversion of the input digital signal to be converted in synchronism with the sampling clock. A delay element 260 provides the signal passing through the digital-analog conversion with a delay equal to the processing time of the jitter detecting circuit 220, and supplies to the jitter applying circuit 230.

As the jitter detecting circuit 220, a circuit with the same configuration as the circuit 20 shown in FIG. 2 can be employed. In addition, as for the configuration of the jitter applying circuit 230, a circuit with the same configuration as the circuit 30 shown in FIG. 4 can be used. As for its operation, however, since the signal to be subjected to the phase shift processing is the signal passing through the digital-analog conversion, its operation will be described with reference to FIG. 10.

Figure 10:
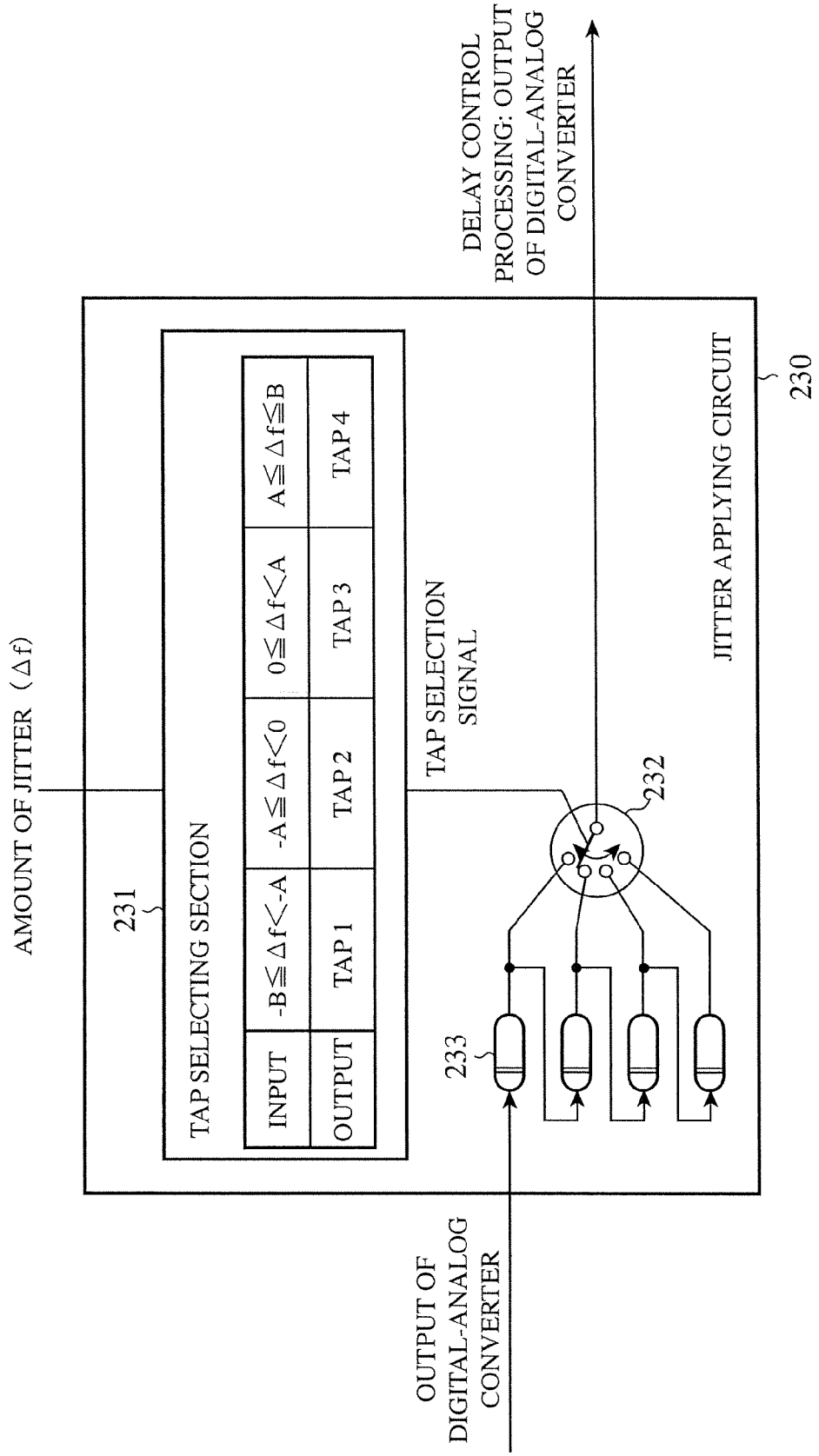
FIG. 10 is a block diagram showing a configuration of a jitter applying circuit of the embodiment 3 in accordance with the present invention.

A tap selecting section 231, receiving the frequency fluctuation $\Delta f$ which represents the amount of jitter detected by the jitter detecting circuit 220, compares it with a predetermined reference voltage (such as −B, −A, 0, A, B). The frequency fluctuation $\Delta f$ is replaced by a tap selection signal according to the large and small relationships with the reference voltage, and is supplied to a tap switching section 232. On the other hand, the signal passing through the digital-analog conversion is supplied to a first end of the series connection of a plurality of delay elements 233, and is provided with the delay as follows. When the number of the delay elements 233 connected in series is assumed to be four as shown in FIG. 10 (actually the number is great), the delay output can be pulled out of each of the four output terminals of the delay elements. Each output terminal of the delay elements 233 is connected to a corresponding tap of the tap switching section 232. Each tap is selected in response to the tap selection signal, and the signal obtained from the tap selected is the signal resulting from providing the delay corresponding to the frequency fluctuation $\Delta f$ to the signal passing through the digital-analog conversion. Thus, the signal passing through the digital-analog conversion has been subjected to the phase shift processing according to the amount of jitter detected.

Next, characteristics of the sampling operation using the digital-analog conversion apparatus of FIG. 9 will be described.

Figure 11:
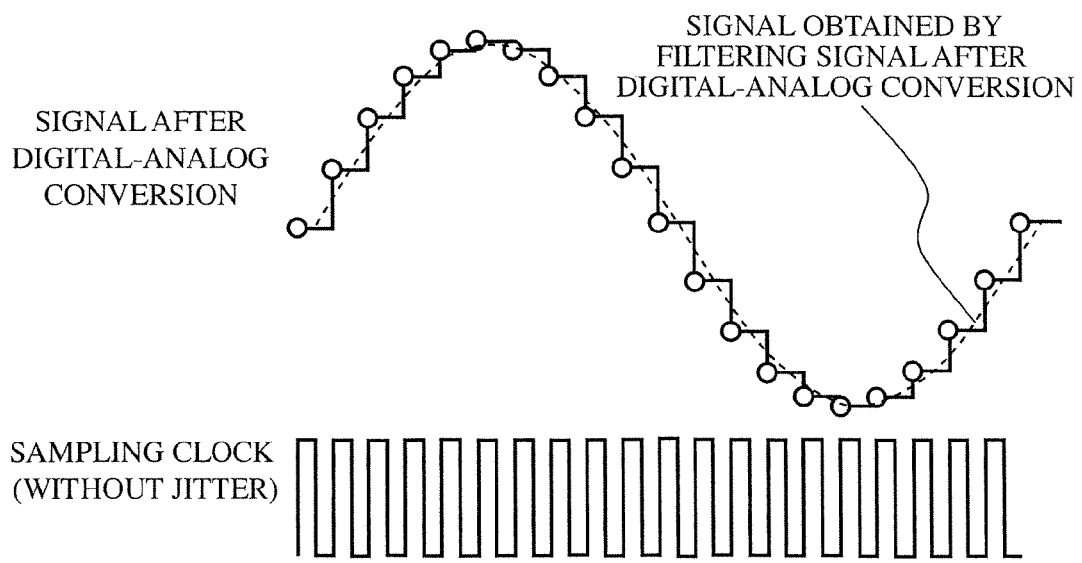
FIG. 11 is a diagram illustrating digital-analog conversion operation due to an ideal sampling clock.
Figure 12:
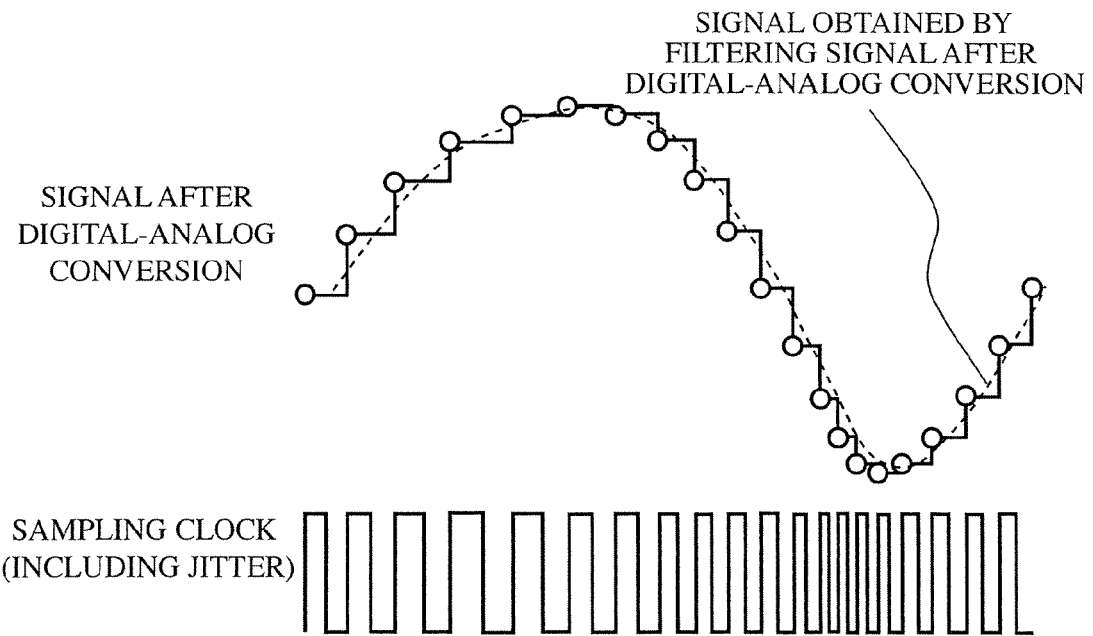
FIG. 12 is a diagram illustrating conventional digital-analog conversion operation based on a sampling clock including jitter.
Figure 13:
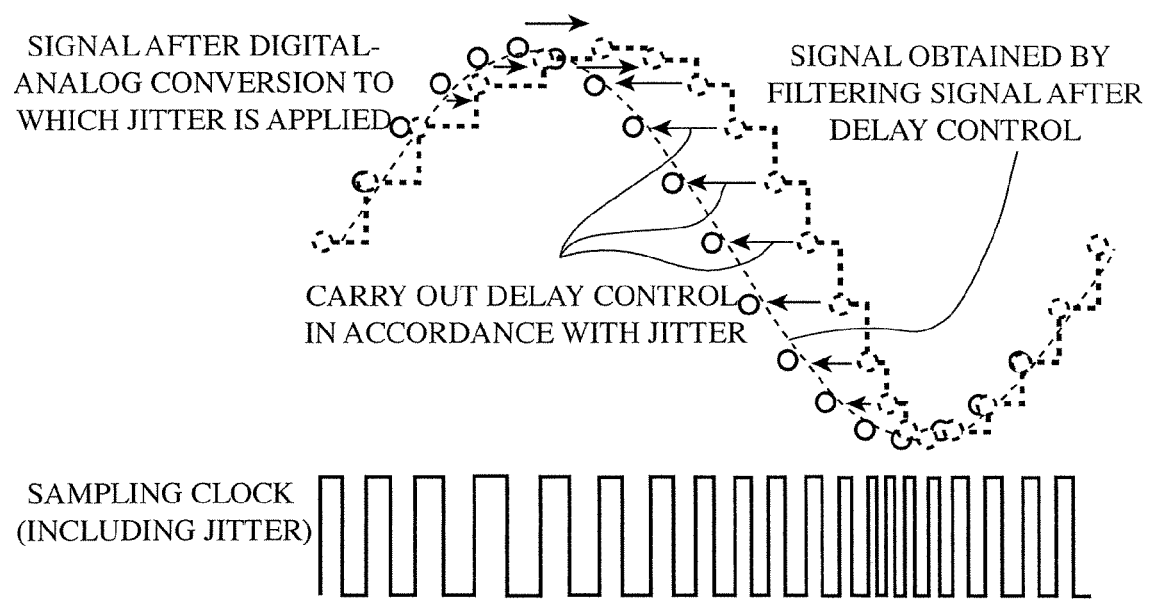
FIG. 13 is a diagram illustrating correction operation after digital-analog conversion based on a sampling clock including jitter of the embodiment 3 in accordance with the present invention.

The signal passing through the digital-analog conversion by the digital-analog converter 240 according to an ideal sampling clock without the jitter component has a stepwise analog waveform as shown in FIG. 11, which is sampled at regular intervals without phase fluctuations. In practice, however, the sampling clock delivered from the oscillator 210 is apt to include the jitter component. Accordingly, the signal passing through the digital-analog conversion by the sampling clock including the jitter component becomes as illustrated in FIG. 12. More specifically, since the sampling clock varies its sampling phases from its original value because of the jitter, the stepwise analog waveform obtained by the digital-analog conversion has a distorted waveform as compared with the ideal waveform without jitter as shown in FIG. 11. In contrast with this, when the digital-analog conversion apparatus in accordance with the present invention is applied, the signal passing through the digital-analog conversion becomes a stepwise analog waveform whose phase fluctuations are compensated as shown in FIG. 13. The compensation is carried out by the jitter applying circuit 230 by adding the delay based on the amount of jitter to the signal passing through the digital-analog conversion. As a result, the analog values (signal passing through filtering in FIG. 13) finally obtained by the digital-analog conversion have substantially the same period as in the ideal state without jitter.

As described above, the present embodiment 3 is configured in such a manner that the jitter detecting circuit detects the amount of jitter included in the sampling clock, and the jitter applying circuit provides the delay based on the amount of jitter detected to the signal passing through the digital-analog conversion, thereby compensating for the phase shift resulting from the digital-analog conversion due to the jitter of the sampling clock. As a result, the present embodiment 3 can obtain the analog values at substantially the same period as in the ideal state without jitter, thereby being able to implement the highly accurate digital-analog conversion.

EMBODIMENT 4

The foregoing embodiment 3 is described by way of example of oversampling in which the frequency band of the signal passing through the digital-analog conversion is equal to or less than half the frequency of the sampling clock. The present embodiment 4 will be described by way of example of the digital-analog conversion apparatus that carries out undersampling.

Figure 14:
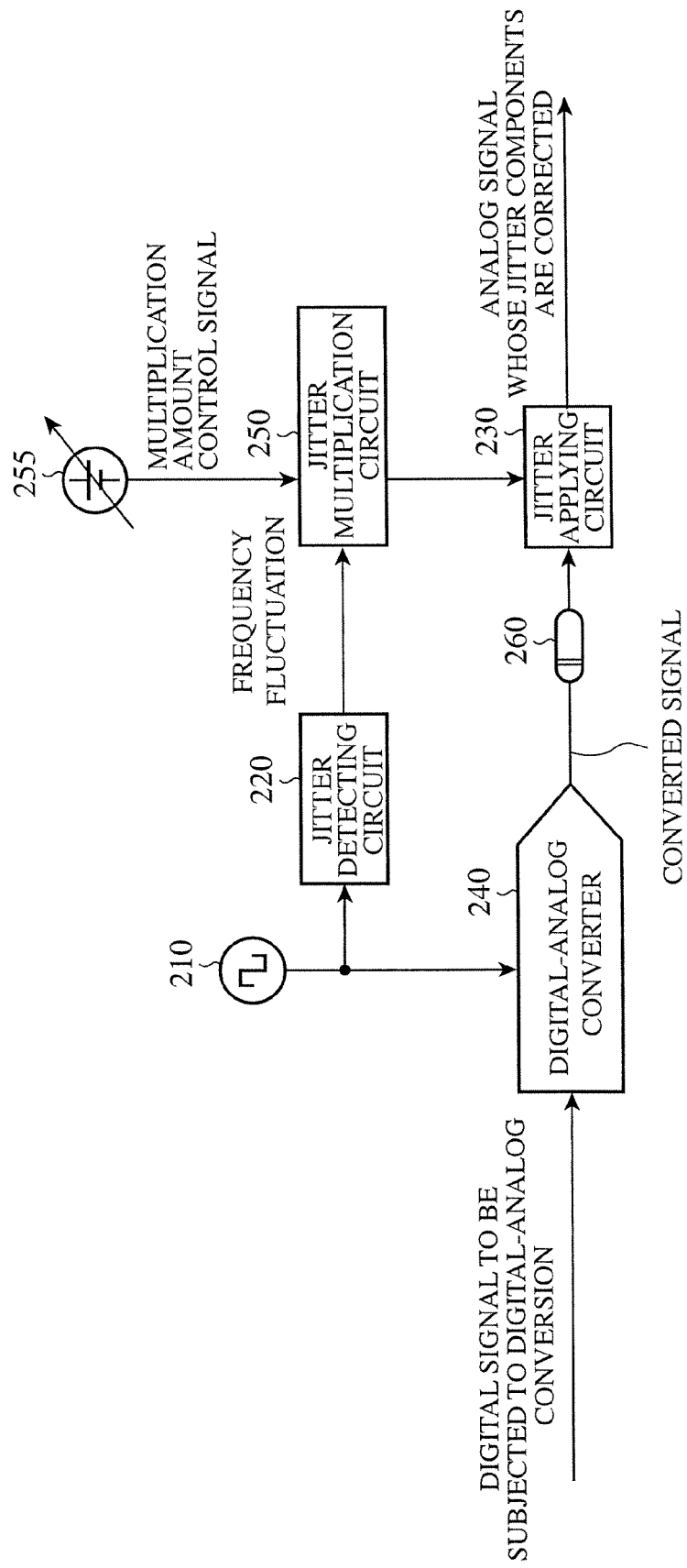
FIG. 14 is a block diagram showing a configuration of the digital-analog conversion apparatus of an embodiment 4 in accordance with the present invention.

Assume here that the frequency of the sampling clock is fs, the minimum frequency in the aliasing components of the signal passing through the digital-analog conversion is f' min, and the maximum frequency is f' max. When aliasing components appearing in the frequency band satisfying the conditions $$N \times fs \leq f'\text{min and } f'\text{max} \leq (N+1) \times fs \qquad (2)$$

the band from f' min to f' max shifts at the frequency N times the jitter of the sampling clock. FIG. 14 is a block diagram showing a configuration of the digital-analog conversion apparatus when carrying out such undersampling. It extracts and uses the aliasing components of harmonics of the output of the digital-analog converter with a filter or the like.

In FIG. 14, the same components as those of FIG. 9 are designated by the same reference numerals and their description will be omitted in principle. The configuration includes in addition to that of FIG. 9 a jitter multiplication circuit 250 and a variable DC voltage source 255.

The jitter multiplication circuit 250 is a circuit for multiplying the amount of jitter, the output of the jitter detecting circuit 220, by N. The value N is made variable by a control signal output from the variable DC voltage source 255. The amount of jitter multiplied by the jitter multiplication circuit 250 is supplied to the jitter applying circuit 230. The jitter applying circuit 230 adds to the signal passing through the digital-analog conversion a delay based on N times the amount of jitter, thereby compensating for the phase fluctuations due to jitter.

As described above, the embodiment 4 is configured in such a manner that the jitter amount multiplication circuit multiplies the amount of jitter detected, and the jitter applying circuit provides the signal after the digital-analog conversion with the delay based on the amount of jitter multiplied, thereby compensating for the phase shift caused by the jitter of the sampling clock. As a result, even in the case of undersampling, the present embodiment 4 can also obtain the analog values at substantially the same period as in the ideal state without jitter, thereby being able to implement the highly accurate digital-analog conversion.

INDUSTRIAL APPLICABILITY

As described above, the analog-digital conversion apparatus and the digital-analog conversion apparatus in accordance with the present invention can prevent the deterioration of the conversion accuracy due to the sampling clock including the jitter component. Accordingly, they are effectively applicable to the analog-digital conversion or digital-analog conversion of such devices as radio communications apparatuses and measurement instruments.

What is claimed is:

1. An analog-digital conversion apparatus comprising:
    an analog-digital converter for carrying out analog-digital conversion of an analog signal;
    an oscillator for generating a sampling clock used for sampling the analog signal by said analog-digital converter;
    a jitter detecting circuit for detecting an amount of jitter included in the sampling clock generated; and
    a jitter applying circuit for providing the analog signal to be subjected to the analog-digital conversion with a delay based on the amount of jitter detected to prevent phase shift of the sampling due to jitter of the sampling clock in said analog-digital converter.

2. The analog-digital conversion apparatus according to claim 1, further comprising a delay element for providing the sampling clock input to said analog-digital converter with a delay equal to a processing time of said jitter detecting circuit and said jitter applying circuit.

3. The analog-digital conversion apparatus according to claim 1, further comprising a jitter amount multiplication circuit for multiplying the amount of jitter detected by said jitter detecting circuit, wherein
    said jitter applying circuit provides the analog signal to be subjected to the analog-digital conversion with a delay based on the amount of jitter multiplied.

4. The analog-digital conversion apparatus according to claim 3, wherein said jitter amount multiplication circuit makes an amount of multiplication variable by a control signal.

5. The analog-digital conversion apparatus according to claim 3, further comprising a delay element for providing the sampling clock input to said analog-digital converter with a delay equal to a processing time of said jitter detecting circuit, said jitter applying circuit and said jitter amount multiplication circuit.

6. A digital-analog conversion apparatus comprising:
    a digital-analog converter for carrying out digital-analog conversion of a digital signal;
    an oscillator for generating a sampling clock used for establishing synchronization in said digital-analog converter;
    a jitter detecting circuit for detecting an amount of jitter included in the sampling clock generated; and
    a jitter applying circuit for providing the signal after the digital-analog conversion with a delay based on the amount of jitter detected to compensate for phase shift occurring in the signal after the digital-analog conversion due to jitter of the sampling clock.

7. The digital-analog conversion apparatus according to claim 6, further comprising a delay element for providing the signal after the digital-analog conversion to be input to said jitter applying circuit with a delay equal to a processing time of said jitter detecting circuit and said jitter applying circuit.

8. The digital-analog conversion apparatus according to claim 6, further comprising a jitter amount multiplication circuit for multiplying the amount of jitter detected by said jitter detecting circuit, wherein
    said jitter applying circuit provides the signal after the digital-analog conversion with a delay based on the amount of jitter multiplied.

9. The digital-analog conversion apparatus according to claim 8, wherein said jitter amount multiplication circuit makes an amount of multiplication variable by a control signal.

10. The digital-analog conversion apparatus according to claim 8, further comprising a delay element for providing the signal after the digital-analog conversion to be input to said jitter applying circuit with a delay equal to a processing time of said jitter detecting circuit, said jitter amount multiplication circuit and said jitter applying circuit.

* * * * *